(12) United States Patent
Cheramy

(10) Patent No.: US 9,543,287 B2
(45) Date of Patent: Jan. 10, 2017

(54) INTEGRATED CIRCUIT AND METHOD FOR FABRICATING AN INTEGRATED CIRCUIT EQUIPPED WITH A TEMPERATURE PROBE

(71) Applicant: Commissariat à l'énergie atomique et aux énergies alternatives, Paris (FR)

(72) Inventor: Severine Cheramy, Claix (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 65 days.

(21) Appl. No.: 14/135,937

(22) Filed: Dec. 20, 2013

(65) Prior Publication Data

US 2014/0183533 A1 Jul. 3, 2014

(30) Foreign Application Priority Data

Dec. 26, 2012 (FR) ...................................... 12 62813

(51) Int. Cl.
*H01L 23/58* (2006.01)
*H01L 27/02* (2006.01)
(Continued)

(52) U.S. Cl.
CPC ........... *H01L 27/0248* (2013.01); *H01L 23/34* (2013.01); *H01L 23/38* (2013.01);
(Continued)

(58) Field of Classification Search
CPC .... H01L 23/34; H01L 23/38; H01L 23/49827; H01L 27/0248; H01L 2224/0401; H01L 2224/05009; H01L 2224/06181; H01L 2224/1301; H01L 2225/06513; H01L 2225/06541
(Continued)

(56) References Cited

U.S. PATENT DOCUMENTS 6,481,886 B1 * 11/2002 Narendrnath ...... G01K 11/3213
250/458.1
2009/0008790 A1 * 1/2009 Lee ........................ H01L 23/481
257/774
(Continued)

FOREIGN PATENT DOCUMENTS

DE 102010029526 12/2011
FR 2878077 11/2004
JP 4258185 9/1992

*Primary Examiner* — Vongsavanh Sengdara
(74) *Attorney, Agent, or Firm* — Occhiuti & Rohlicek LLP

(57) ABSTRACT

This integrated circuit comprises:
 a substrate,
 a first electrical conductor comprising a first end, the first electrical conductor being electrically insulated from the substrate,
 a second electrical conductor comprising a second end, the second electrical conductor being electrically insulated from the substrate and electrically insulated from the first electrical conductor except at the second end which is mechanically and electrically directly in contact with the first end to form an electrical junction.
The first and second ends are entirely buried to at least 5 μm depth inside the substrate and produced, respectively, in different first and second materials chosen for the absolute value of the Seebeck coefficient of the junction to be greater than 1 μV/K at 20° C. such that the combination of these first and second conductors forms a temperature probe.

9 Claims, 5 Drawing Sheets

(51) Int. Cl.
*H01L 23/34* (2006.01)
*H01L 23/38* (2006.01)
*H01L 23/498* (2006.01)

(52) U.S. Cl.
CPC   *H01L 23/49827* (2013.01); *H01L 2224/0401* (2013.01); *H01L 2224/05009* (2013.01); *H01L 2224/06181* (2013.01); *H01L 2224/16145* (2013.01); *H01L 2225/06513* (2013.01); *H01L 2225/06541* (2013.01); *H01L 2924/1301* (2013.01)

(58) Field of Classification Search
USPC .............................................. 257/48; 438/54
See application file for complete search history.

(56)     References Cited

U.S. PATENT DOCUMENTS

2010/0219525 A1    9/2010  Ibaraki
2011/0109381 A1*   5/2011  Foster, Sr. .......... H01L 25/0657
                                                     327/565
2012/0168935 A1*   7/2012  Huang .............. H01L 21/76898
                                                     257/737

* cited by examiner

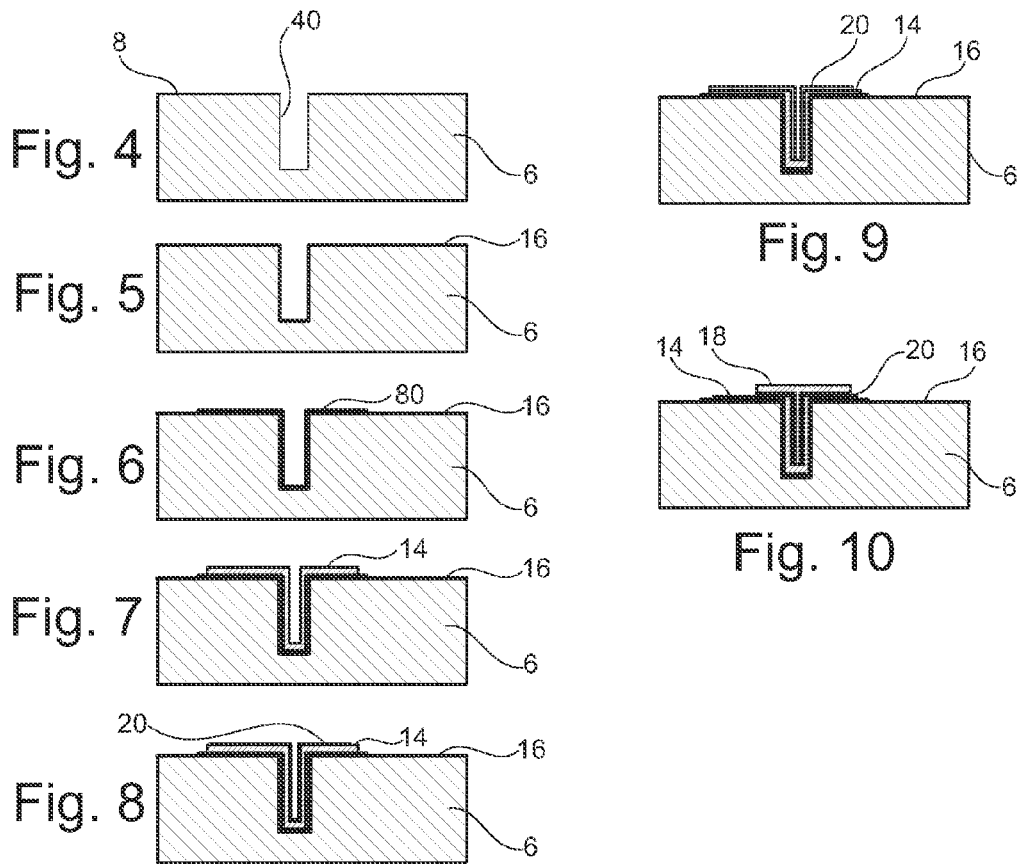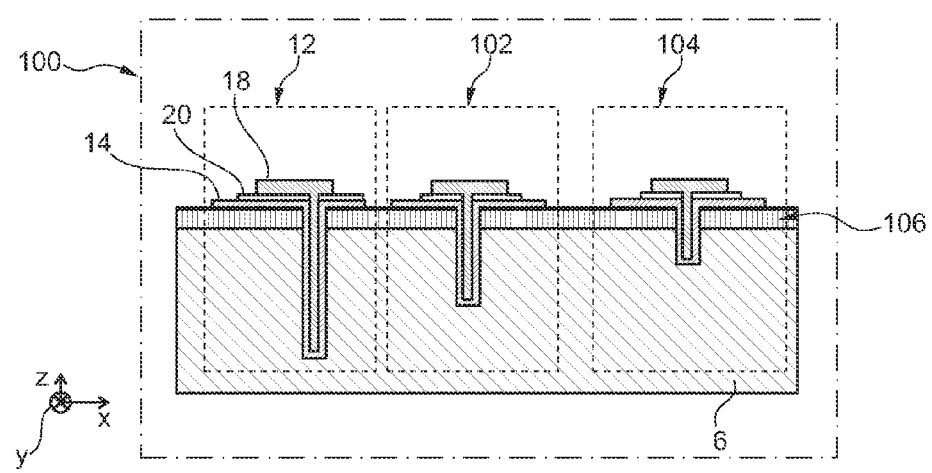

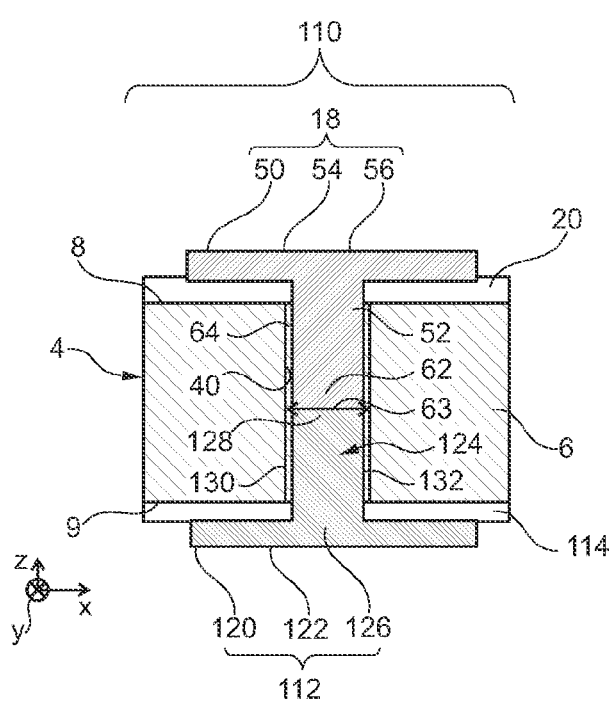

INTEGRATED CIRCUIT AND METHOD FOR FABRICATING AN INTEGRATED CIRCUIT EQUIPPED WITH A TEMPERATURE PROBE

RELATED APPLICATIONS

Under 35 USC 119, this application claims the benefit of the Dec. 26, 2012 priority date of French application 1262813, the contents of which are herein incorporated by reference.

FIELD OF DISCLOSURE

The invention relates to an integrated circuit and a method for fabricating an integrated circuit equipped with a temperature probe.

BACKGROUND

An integrated circuit comprises a substrate on the surface of which and/or inside of which are produced electronic components to form one or more electronic chips.

These integrated circuits are produced by using collective fabrication methods often called "microelectronics" methods. For example, these methods implement a machining of the substrate or layer by photolithography and etching (for example DRIE (Deep Reactive Ion Etching)) and/or a structuring by epitaxial growth and deposition of conductive material. By virtue of these microelectronics methods, the fabricated electronic components are small. In many cases, these components have dimensions of a micrometric or nanometric order. The dimension of micrometric or nanometric order is generally less than 10 µm and, typically, less than 1 µm.

The substrate can be homogeneous, such as a block. Or, the substrate can be heterogeneous, such as a plurality of stacked thin layers. In this case, the electronic components are produced on the surface and/or inside this substrate and the electronic chip or chips are arranged at least partly on the surface of this substrate.

The substrate can also be a "multilayer" substrate. Such a substrate is made of up of a stack of substrates assembled one on top of the other. The stacked substrates can themselves be homogeneous or heterogeneous. Here, to distinguish this substrate from the stacked substrates of which it is composed, the stacked substrates are called "layers." In the case of a multilayer substrate, the stacked layers are not thin layers. In particular, each stacked layer exhibits a sufficient rigidity in itself to be handled without being bonded onto another substrate. To this end, typically, the stacked layers have a thickness at least 10 or 100 times greater than the thickness of the thin layers. For example, the thin layers have a thickness of less than 1 µm or 0.1 µm, whereas the stacked layers have a thickness greater than 5 or 10 or 100 µm. Several of these layers can include electronic components on the level of the assembly interface between two successive layers of the substrate. These electronic components produced on the surface of the stacked layers constitute one or more electronic chips. The integrated circuit then comprises a stack of electronic chips, stacked one on top of the other. These integrated circuits in which a plurality of electronic chips are stacked one on top of the other are often called "3D integrated circuits."

One of the main limitations on performance of integrated circuits is the quantity of heat that they produce and which has to be removed. This problem is even greater in 3D integrated circuits.

In order to evaluate, as correctly as possible, the heat from an integrated circuit, it is useful to know the places inside this integrated circuit where the heat is concentrated and reaches a maximum. These places are called "hot spots." It is also important to know the diffusion from these hot spots inside the circuit.

One of the difficulties commonly encountered is that of knowing both the positions of these hot spots and the diffusion from these hot spots. This difficulty is exacerbated when the hots spots are inside the substrate, especially if they are more than 5 µm away from an outer face of the substrate.

It is known to measure temperature on the surface of the substrate, but now how to directly measure temperature inside the substrate. Thus, currently, to estimate the temperature of a hot spot situated inside the substrate, simulation software is used. Such software is based on mathematical models that make it possible to predict the flow of the heat fluxes inside the substrate. To improve the estimation of this software, the latter can also use, as input data, the temperatures measured on the surface of the substrate. However, these models can prove imprecise, notably in estimating the dynamic aspects of certain thermal phenomena.

The prior art is also known from: FR2878077A1, DE102010029526A1 and US2010/219525A1.

SUMMARY

The invention aims to remedy this drawback by proposing another way to measure the temperature inside the substrate of an integrated circuit.

In one aspect, the invention features an integrated circuit having a substrate extending essentially in a plane called "plane of the substrate", at least one electronic component produced inside and/or on the surface of the substrate, a first electrical conductor comprising a first bump contact on the surface of the substrate and a first end, the first electrical conductor being electrically insulated from the substrate, a second electrical conductor comprising a second bump contact on the surface of the substrate and a second end, the second electrical conductor being electrically insulated from the substrate and electrically insulated from the first electrical conductor except at the second end that is mechanically and electrically directly in contact with the first end to form an electrical junction, in which the first and second ends are entirely buried to at least 5 µm depth inside the substrate and produced, respectively, in different first and second materials chosen for the absolute value of the Seebeck coefficient of the junction to be greater than 1 µV/K at 20° C. such that the combination of these first and second conductors forms a temperature probe.

In the above integrated circuit, since the junction has a Seebeck coefficient greater than 1 µV/K at 20° C., the difference in potentials between the first and second bump contacts is a function of the temperature of this junction as well as of the value of this Seebeck coefficient. Furthermore, the junction is buried inside the substrate. The difference in potentials between the first and the second bump contacts is therefore representative of the temperature under the surface of, and therefore inside, the substrate. More specifically, the voltage difference indicates the temperature at the place of the junction.

Since the bump contacts are on the surface, the temperature inside the substrate is easy to read from these bump contacts. Thus, the temperature inside the substrate of the above integrated circuit can easily be measured.

Furthermore, the junction described above can be produced by microelectronics methods. This means that it can easily be produced while the integrated circuit is fabricated.

In some embodiments, the first and second electrical conductors comprise, respectively, first and second extensions driven into the substrate to electrically connect the first and second ends, respectively, to the first and second bump contacts, these first and second extensions comprising, respectively, a first and a second cylinders arranged inside one and the same blind via at least 5 µm deep formed from a face of the substrate, at least the distal ends buried inside the substrate of the first and second cylinders being produced, respectively, in the first and second materials to form, respectively, the first and second buried ends of the first and second electrical conductors, these first and second cylinders extending inside the via from the face of the substrate to, respectively, the first and second ends, and the integrated circuit also includes least a layer of electrical insulator situated everywhere between the first and second cylinders except between the first and second ends.

In other embodiments, the first and second electrical conductors comprise, respectively, first and second extensions driven into the substrate to electrically connect the first and second ends, respectively, to the first and second bump contacts, the first extension comprising a first cylinder, at least the distal end of which buried inside the substrate is produced in the first material to form the first end of the first electrical conductor, this first cylinder extending inside a first via formed from a first face of the substrate to the first end, the second extension comprising a second cylinder, at least the distal end of which, buried inside the substrate, is produced in the second material to form the second end of the second electrical conductor, this second cylinder extending inside a second via to the second end, this second via being formed from a second face of the substrate situated on the side opposite the first face, the bottom of the second via emerging on the first end of the first cylinder.

In yet other embodiments, the substrate forms a first substrate having a top face, and the circuit comprises a second substrate having a bottom face directly joined to the top face of the first substrate and a top face on the side opposite its bottom face, these first and second substrates joined together forming, respectively, first and second layers of a third, thicker substrate, these layers extending essentially parallel to the plane of the third substrate, a blind via first and second vias being formed from the face or faces of the first substrate, and the second substrate comprising third and fourth bump contacts arranged on its top face and electrically connected, respectively, to the first and second bump contacts.

In other embodiments, the substrate comprises at least one first layer having a top face and one second layer having a bottom face, assembled directly on the top face of the first layer, these layers extending essentially parallel to the plane of the substrate, the first and second electrical conductors comprising, respectively, first and a second conductive tracks produced on the top face of the first layer or on the bottom face of the second layer and extending essentially parallel to the plane of the substrate, distal ends of these tracks situated between the first and second layers forming, respectively, the buried first and second ends of the first and second electrical conductors.

Among these embodiments are those in which the distal ends of the first and second tracks overlap one another in a direction at right angles to the plane of the substrate.

Also among the embodiments are those in which the first and second conductors comprise, respectively, first and second extensions driven into the substrate to electrically connect the first and second tracks, respectively, to the first and second bump contacts, at least one of the extensions being formed via a via passing right through the first or the second layer.

In some embodiments, the shortest distance between each bump contact and the junction is at least greater than 50 µm.

These embodiments of the integrated circuit also offer the following advantages:

An advantage to the foregoing integrated circuit is that producing the junction at the bottom of a blind via is simple to produce using microelectronics fabrication methods.

Another advantage is that the production of the junction at the place where two vias hollowed out from opposite outer faces meet is simple to carry out by microelectronics fabrication methods and makes it possible to avoid the production of an insulating layer interposed against the first and second cylinders of the first and second electrical conductors.

Another advantage is that the production of the junction from first and second conductive tracks produced on faces of layers attached to one another makes it possible to produce a junction situated inside the substrate in a relatively simple manner.

An advantage of overlapping the ends of the first and second tracks that form the junction is that it becomes possible to increase the contact surface area and increase the sensitivity of the temperature measurement.

An advantage of using through-vias to connect the junction to the bump contacts situated on an outer face of the substrate is that it becomes possible to bury the junction more deeply.

An advantage of spacing the bump contacts at least 50 µm away from the junction is that it makes it possible to increase the accuracy of the measurement.

In another aspect, the invention features a method for fabricating an integrated circuit equipped with a temperature probe. Such a method includes (a) the supply of a substrate extending essentially in a substrate plane, (b) the production on a surface of the substrate and/or inside the substrate of at least one electronic component of the integrated circuit, (c) the production, by microelectronics methods, of a first electrical conductor comprising a first bump contact on a surface of the substrate and a first end, the first electrical conductor being electrically insulated from the substrate, and (d) the production, by microelectronics methods, of a second electrical conductor comprising a second bump contact on a surface of the substrate and a second end, the second electrical conductor being electrically insulated from the substrate and electrically insulated from the first electrical conductor except at the second end which is mechanically and electrically directly in contact with the first end to form an electrical junction, in which, in steps (c) and (d), the first and second ends are entirely buried to at least 5 µm depth inside the substrate and produced, respectively, in different first and second materials chosen for the absolute value of the Seebeck coefficient of the junction to be greater than 1 µV/K at 20° C. such that the combination of these first and second conductors forms the temperature probe.

In some practices steps (c) and (d) comprise the production of first and second extensions, driven into the substrate to electrically connect the first and second ends, respectively, to the first and second bump contacts, the production of these extensions comprising: (1) the formation of a blind via at least 5 µm deep from an outer face of the substrate, (2) the deposition inside the same via of a first and a second cylinders of which at least the distal ends buried inside the substrate are produced, respectively, in the first and second materials to form, respectively, the buried first and second ends of the first and second electrical conductors, these first and second cylinders extending inside the via from the outer face of the substrate to, respectively, first and second ends, and (3) the deposition of an electrically insulating layer between the first and second cylinders except between the first and second ends.

Among these practices are those in which the deposition of the electrically insulating layer everywhere between the first and second cylinders except between the first and second ends includes, after the deposition of the first cylinder and before the deposition of the second cylinder depositing the electrically insulating layer everywhere on the face exposed to the outside of the first cylinder, and eliminating the electrically insulating layer at the first end only.

In other practices, steps (c) and (d) comprise the production of first and second extensions driven into the substrate to electrically connect the first and second ends, respectively, to the first and second bump contacts, the production of these extensions comprising: (1) the formation of a first blind via of at least 5 µm depth from a first outer face of the substrate, (2) the deposition in the first blind via of a first cylinder, of which at least the distal end buried inside the substrate is produced in the first material to form the first end of the first electrical conductor, this first cylinder extending inside the first via from the first outer face of the substrate to the first end, (3) the formation of a second blind via of at least 5 µm depth from a second outer face of the substrate situated on a side opposite the first face, the bottom of this second via emerging on the first end of the first cylinder, and (4) the deposition in the second blind via of a second cylinder, of which at least the distal end buried inside the substrate is produced in the second material to form the second end of the second electrical conductor, this second cylinder extending inside the second via from the second outer face of the substrate to the second end.

In some practices, the substrate defines a first substrate having a top face. Among these practices are those that include the assembly of the top face of the first substrate directly on a bottom face of a second substrate, these assembled first and second substrates then forming, respectively, first and second layers of a third, thicker substrate, these layers extending essentially parallel to a plane of the third substrate, and the production of third and fourth bump contacts on a top face of the second substrate, this top face being situated on the side opposite its bottom face and these third and fourth bump contacts being electrically connected, respectively, to the first and second bump contacts.

Also included are practices that comprise the production of a first conductive track on a top face of a first layer or on a bottom face of a second layer, the production of a second conductive track on the top face of the first layer or on the bottom face of the second layer, and the assembly of the top face of the first layer directly on the bottom face of the second layer in such a way that the distal ends of the tracks situated between the first and second layers form, respectively, the buried first and second ends of the first and second electrical conductors, these assembled first and second layers forming the substrate, these layers extending essentially parallel to the plane of the substrate.

BRIEF DESCRIPTION OF THE DRAWINGS

The invention will be better understood on reading the following description, given solely as a non-limiting example and with reference to the drawings in which

FIGS. 4 to 10 are schematic illustrations in vertical cross section of different steps in the fabrication of the integrated circuit of FIG. 1;

FIG. 11 is a schematic illustration, in vertical cross section, of a second embodiment of an integrated circuit;

FIG. 12 is a schematic illustration, in vertical cross section, of a third embodiment of an integrated circuit;

FIG. 13 is a flow diagram of a method for fabricating the integrated circuit of FIG. 12;

FIG. 14 is a schematic illustration, in vertical cross section, of a fourth embodiment of an integrated circuit;

In these figures, the same references are used to designate the same elements.

Hereinafter in this description, the features and functions that are well known to a person skilled in the art are not described in detail.

DETAILED DESCRIPTION

Figure 1:
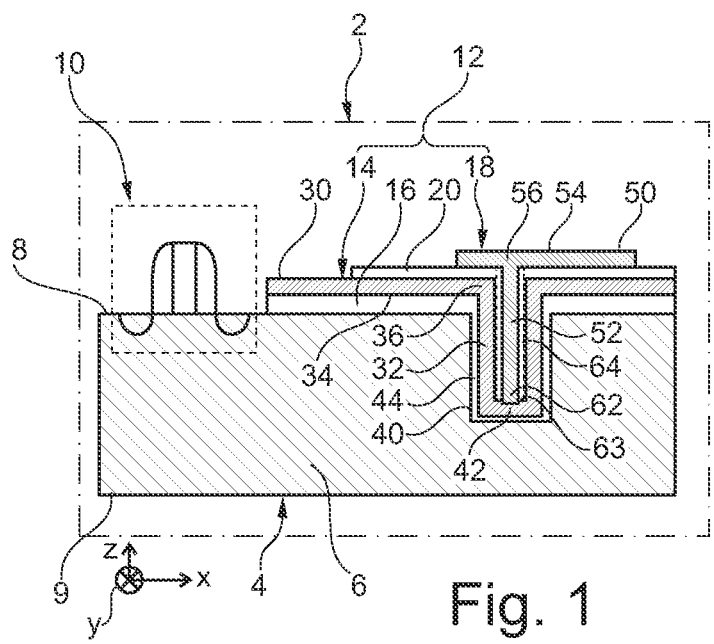
FIG. 1 is a schematic illustration, in vertical cross section, of a first embodiment of an integrated circuit.
Figure 2:
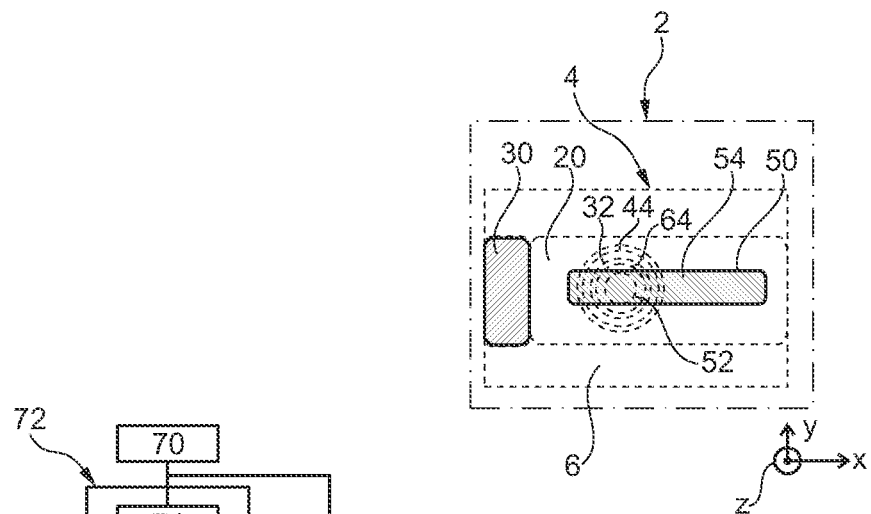
FIG. 2 is a schematic illustration, in plan view, of the integrated circuit of FIG. 1.

FIGS. 1 and 2 represent an integrated circuit 2. This integrated circuit 2 comprises an electronic chip 4 or "die," encapsulated in an electrically insulating package. The package protects the chip 4 against attacks from the outside environment.

The integrated circuit 2 also comprises terminals for the electrical connection of the chip 4 to a printed circuit. These connection terminals are typically embodied in the form of leads protruding out of the package or in the form of conductive pads intended to be soldered onto a printed circuit.

To simplify the figures, in this patent application, the connection are not represented, and only a portion of the chip is represented.

The chip 4 comprises a homogeneous or heterogeneous substrate 6 extending essentially in a plane called a "plane of the substrate," or a "substrate plane." The plane of the substrate extends horizontally and parallel to orthogonal X and Y directions. The vertical direction is represented by a Z direction, at right angles to the X and Y directions. Hereinafter in this description, the terms "top", "bottom", "above" and "below" are defined relative to the Z direction.

The electronic chip 4 also comprises electronic components produced on a top horizontal face 8 of the substrate 6. The substrate 6 also comprises a bottom horizontal face 9 situated on the side opposite the face 8.

The faces 8 and 9 are outer faces of the substrate 6. This means that they delimit the outer perimeter of the substrate 6.

In the interests of simplification, it has been chosen to represent the substrate 6 as a block substrate. Its thickness is typically greater than 10, 100, or 500 µm. In some embodiments, the substrate 6 is made of silicon.

The integrated circuit 2 comprises a large number of electronic components, for example, more than 100,000 or more than $10^6$ electronic components. To simplify FIG. 1, only a single electronic component 10 is represented. In FIG. 2 and in the subsequent figures, the electronic components are not represented. Obviously, the component 10 represented is highly simplified. Furthermore, it is represented to a scale that does not correspond to that of the rest of the circuit and notably of the electrical junction described later.

The electronic component 10 is, for example, an active electronic component. An active electronic component is defined as an electronic component that makes it possible to increase the power of a signal, for example the voltage or the current, or both. The additional power is recovered through a power supply. These are typically components produced from semiconductors such as transistors or thyristors. Conversely, a passive electronic component is defined as one that does not make it possible to increase the power of a signal. These passive electronic components typically include resistors, capacitors, inductors, coils, diodes, or any assembly of these components.

In the illustrated embodiment, the component 10 is a transistor, such as a CMOS (Complementary Metal Oxide Semiconductor) transistor. Typically, the channel, the drain and the source of this component 10 are directly implanted in the surface 8 by doping.

The integrated circuit also comprises a temperature probe 12 that makes it possible to measure the temperature inside the substrate 6. Here, "inside the substrate 6" should be understood to designate a position situated at more than 5 μm depth, and preferably at more than 10 or 20 μm depth, inside the substrate 6. In other words, this position is at least d micrometres from any outer face of the substrate, where d is greater than or equal to 5 μm and typically greater than or equal to 10 μm or 20 μm.

The probe 12 comprises an electrical conductor 14 produced in a first conductive material, an insulating layer 16 electrically insulating the conductor 14 from the substrate 6, an electrical conductor 18 produced in a second conductive material, and an insulating layer 20 electrically insulating the conductor 18 from the conductor 14.

As used herein, a material is considered to be conductive if its resistivity at 20° C. is less than 10-5 or 10-6 Ω·m. Conversely, a material or a layer is considered to be electrically insulating if its resistivity at 20° C. is greater than 105 or 106 Ω·m.

The electrical conductor 14 comprises a horizontal bump contact 30 and a vertical extension 32 that is sunk into the substrate 6. The bump contact 30 is accessible from the outside of the chip 4. Because of this, the insulating layer 20 does not cover it.

In the illustrated embodiment, an end of a horizontal electrical track 34 that is entirely deposited on the insulating layer 16 forms the bump contact 30. The track 34 continues horizontally between the insulating layers 16 20 to electrically connect a top end 36 of the extension 32 to the bump contact 30. The top end 36 of the extension 32 is flush with the surface of the insulating layer 16. The shortest distance separating the bump contact 30 from the top end 36 is preferably greater than 50 or 100 μm. In the illustrated embodiment, the track 34 continues horizontally between the conductors 16 and 20 all around the top end 36.

The bump contact 32 is a hollow cylinder deposited inside a blind via 40, directly hollowed out in the substrate 6 from the face 8. The via 40 is sunk vertically into the substrate 6. In one example, the cross section of the via 40 is circular. The depth of the via 40 is chosen as a function of the place inside the substrate 6 at which the temperature has to be measured. This depth is strictly greater than 5 μm and, preferably, greater than 10 μm, so as to allow for a measurement of the temperature inside the substrate 6.

On the side opposite the top end 36, the extension 32 is terminated by a distal end 42 situated at more than 5 μm under the face 8 of the substrate 6.

An insulating coating 44 insulates the extension 32 is insulated from the inner walls of the via 40. In the via 40, the coating 44 covers all the vertical walls and the bottom of the via 40. Here, the coating 44 forms only a single block of material with the insulating layer 16.

The electrical conductor 18 comprises a horizontal bump contact 50, and a vertical extension 52 that is sunk into the substrate 6.

The bump contact 50 can be accessed from outside the chip 4. In the illustrated embodiment, the end of a horizontal electrical track 54 that is entirely deposited on the insulating layer 20 forms the bump contact 50. This, in turn, is entirely deposited on the track 34.

The track 54 continues from the bump contact 50 to a top end 56 of the extension 52. The top end 56 is flush with the surface of the insulating layer 20. The shortest distance that separates the top end 56 from the bump contact 50 is greater than 50 μm or 100 μm.

In the illustrated embodiment, the track 54 is continued on either side of the top end 56.

The extension 52 is a solid cylinder deposited inside the hollow cylinder formed by the extension 32. On the side opposite the top end 56, the extension 52 is terminated by a bottom distal end 62 situated at more than 5 μm under the face 8 of the substrate 6. The end 62 is directly in mechanical and electrical contact with the end 42 to form a junction 63.

The extension 52 is electrically insulated from the extension 32 everywhere by an insulating coating 64, except between the ends 42 and 62. Here, the coating 64 forms a vertical hollow cylinder interposed between the extensions 32 and 52. This coating 62 forms only a single block of material with the insulating layer 20.

In the illustrated embodiment, all the elements of each conductor 14, 18 are produced in the same conductive material. The materials of the conductors 14 and 18 are chosen such that the junction 63 exhibits a Seebeck coefficient with an absolute value greater than 1 μV/K at 20° C. and, preferably, greater than 5 or 10 μV/K at 20° C.

For example, the materials of the conductors 14 and 18 are chosen from the following table to obtain one of the junction types detailed in the following table:

| Junction type | Composition of the first/second materials |
| --- | --- |
| J | Iron/Constantan (nickel + copper alloy) |
| K | Chromel (nickel + chromium alloy)/Alumel (nickel + aluminium (5%) + silicon alloy) |
| N | nicrosil (nickel + chromium (14%) + silicon (1.5%) alloy)/nisil (nickel + silicon (4.5%) + magnesium (0.1%) alloy) |
| T | Copper/Constantan (copper + nickel alloy) |
| R | Platinum-Rhodium (13%)/Platinum |
| S | Platinum-Rhodium (10%)/Platinum |

Preferably, the type of the junction is type T, J, K, or N, and advantageously type T because the materials involved in this type of junction are simple to shape with the standard microelectronics methods.

The operation of the integrated circuit 2 is as follows. The junction 63 forms a thermocouple, also called "hot weld." This junction 63 is at the temperature to be measured. Because of the Seebeck effect, a difference in potentials occurs between the bump contacts 30 and 50. This difference is a function of the temperature of the junction 63. The bump contacts are sufficiently far away from the junction 63 to form a reference junction, or "cold weld," because these bump contacts are at the same temperature. For example, the bump contacts 30, 50 are at room temperature, or maintained at a reference temperature such as 0° C. The temperature of the junction 63 can be obtained using the following relationship: Sab=(VB1−VB2)/(TB1−TJ1), in which (VB1−VB2) is the difference in potentials between the bump contacts 30 and 50, TB1 is the temperature of the bump contacts 30 and 50, TJ1 is the temperature of the junction 63, and Sab is the value of the Seebeck coefficient of the junction 63, which is known for a pair of given materials.

The difference in potentials between the bump contacts 30 and 50 is, for example, read with a probe tester during the fabrication of the integrated circuit or by electronic components of the integrated circuit itself in such a way that the integrated circuit has the capacity to process and use the measured temperature. In another embodiment, the difference in potentials is transmitted out of the integrated circuit to, for example, a printed circuit equipped with electronic components suitable for processing this information.

Figure 3:
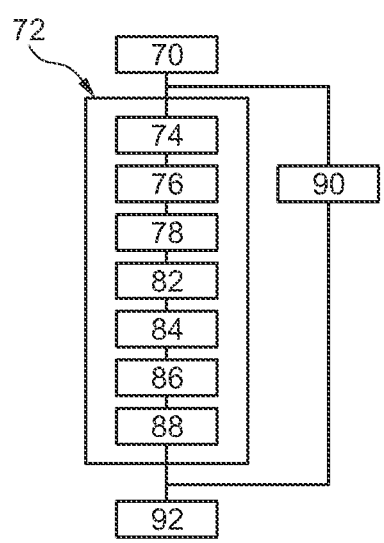
FIG. 3 is a flow diagram of a method for fabricating the integrated circuit of FIG. 1.

The fabrication of the integrated circuit 2 will now be described using the method of FIG. 3 and of FIGS. 4 to 10.

The method begins with step 70, supplying the substrate 6.

Then, in step 72, the conductors 14 and 18 are produced. This step 72 begins with step 74 of forming the blind via 40 from the face 8 (FIG. 4). For example, the via 40 is hollowed out by photolithography, then deep etching DRIE (Deep Reactive Ion Etching).

In step 76, a layer made of electrically insulating material such as $SiO_2$ is deposited to form, at the same time, the insulating layer 16 and the coating 44 (FIG. 5). For example, the deposition is performed by CVD (Chemical Vapour Deposition) or PVD (Physical Vapor Deposition). The thickness of the insulating layer deposited is typically greater than 10 nm and, generally, less than 5 μm.

In step 78, if necessary, to allow for the bonding of the material of the conductor 14, a bond coat 80 is deposited on the layer 16 and the coating 44 (FIG. 6). For example, the bond coat 80 is made of titanium or of chromium.

In step 82, the conductor 14 is deposited. For this, a layer of the material of the conductor 14 is deposited, then shaped if necessary by photolithography and etching (FIG. 7). For example, this layer of conductive material is deposited by PVD or CVD or ECD (Electrochemical Deposition). The thickness of the conductive layer is typically greater than 100 nm and, generally, less than 10 or 20 μm.

In step 84, the insulating layer 20 and the coating 64 are deposited, as shown in FIG. 8. For example, this operation 84 is carried out in the same way as the operation 76.

In step 86, the insulating layer 20 deposited on the bottom of the via 40 is eliminated, for example by etching (FIG. 9) to bare the end 42 of the conductor 14. In some practices, the etching is an RIE (Reactive Ion Etching) type of etching.

In step 88, a layer of the material of the conductor 18 is deposited then shaped (FIG. 10). In some practices, this operation is carried out in the same way as step 82.

either before step 72, after step 72, or in parallel with step 72, in step 90, the electronic components of the integrated circuit, such as the electronic component 10, are fabricated on the substrate 6.

After steps 72 and 90, in step 92, the substrate 6 is cut to separate the different chips 4 produced simultaneously in the preceding steps. Then, each separated chip is encapsulated in an individual package equipped with connecting leads or pads.

FIG. 11 represents an integrated circuit 100 identical to the integrated circuit 2, except that it includes, in addition to the temperature probe 12, two other temperature probes 102 and 104. Also, in the integrated circuit 100, the electronic components are transistors, for example MOS (Metal Oxide Silicon) transistors, implanted in an active layer 106, the outer face of which corresponds to the top face 8 of the substrate.

The probes 102 and 104 are identical to the probe 12 except that the depths where the junctions of the probes 102 and 104 are situated are different from that where the junction 63 is situated. This makes it possible to simultaneously measure several temperatures inside the substrate 6 at different depths. For this, here, only the depth of the via 40 of the probes 102 and 104 differs from the depth of the via 40 of the probe 12. The cross section of the vias of the probes 102 and 104 is, for example, identical to the cross section of the via 40 of the probe 12.

FIG. 12 represents a temperature probe 110 that can be used instead of the probe 12 to measure the temperature inside the substrate 6 of the chip 4. The probe 110 is identical to the probe 12 except that the electrical conductor 14 and the insulating layer 16 are replaced, respectively, by an electrical conductor 112 and an insulating layer 114.

In the embodiment of FIG. 12, the junction 63 is situated inside the substrate, for example at mid-height, between the faces 8 and 9 of the substrate 6. In these conditions, the conductor 112 and the layer 114, and the conductors 18 and the layer 20 are symmetrical, respectively, in relation to a horizontal plane passing through the junction 63. The extension 62 of the conductor 18 and the coating 64 entirely fill the via 40. The conductor 112 and the layer 114 are, for example, produced in the same materials as, respectively, the conductor 14 and the layer 16. In this embodiment, the bump contact, the electrical track, the extension, the top and bottom ends of this extension bear, respectively, the numerical references 120, 122, 124, 126 and 128. The via, symmetrical with the via 40, in which the extension 124 is housed, bears the reference 130. Finally, the coating electrically insulating the extension 124 of the substrate 6 bears the reference 132. The junction 63 is here in the place where the ends 62 and 128 are directly in mechanical and electrical contact one on top of the other.

The operation of this probe 110 is deduced from the operation of the probe 12 described previously.

FIG. 13 represents a method for fabricating the probe 110. This method is identical to the method of FIG. 3, except that step 72 is replaced by a step 140.

Step 140 begins with step 142 for forming the via 40. This step 142 is, for example, identical to step 74.

In step 144, the layer 20 and the coating 64 are deposited. In some practices, this involves the deposition of a layer of $SiO_2$ produced as described with respect to the operation 76.

In step 146, if necessary, a bond coat is deposited. This step is, for example, identical to step 78.

In step 148, the electrical conductor 18 is deposited. This step is, for example, identical to step 82, except that the thickness of the layer of the conductive material deposited can be different. In some practices, this thickness is sufficient to totally fill the via 40. However, totally filling the via 40 is not mandatory.

In step 149, the track 54 is shaped, for example, by photolithography and etching.

In step 150, the via 130 is formed from the bottom face 9 of the substrate. Step 150 is, for example, identical to step 142 except that the via is hollowed out from the face 9.

In step 152, the insulating layer 114 and the coating 132 are deposited. In some practices, step 152 is carried out in the same way as step 144, but in the via 130.

In step 154, only the bottom of the via 132 is etched until the end 62 of the extension 52 is bared. For example, this step is carried out using an RIE etching.

In step 156, if necessary, a bond coat is deposited. This step 156 is, for example, carried out like step 146.

In step 158, the conductor 112 is deposited. In some practices, this step is carried out like step 148.

Finally, in step 160, the track 122 is shaped. In some practices, this step is carried out like step 149.

FIG. 14 represents an integrated circuit 170. This integrated circuit 170 comprises two electronic chips 172 and 173 stacked one above the other and housed inside one and the same package equipped with connecting leads or pads.

More specifically, the integrated circuit 170 comprises a substrate 174 extending essentially in a horizontal plane. The substrate 174 comprises a top face 176 and a bottom face 178 situated on the opposite side. The thickness of the substrate 174 is, for example, the same as the thickness of the substrate 6.

In the illustrated embodiment, the substrate 174 is a multilayer substrate produced by the assembly, one on top of the other with no degree of freedom, of a plurality of layers in the Z direction. For example, the different layers are assembled one on top of the other using fusible balls such as balls 180 produced in a brazing alloy. Typically, the brazing alloy comprises tin. In FIG. 14, the balls 180 are not represented to scale. Thus, the space between the different layers forming the substrate 174 is exaggerated in this figure.

To simplify FIG. 14, only two horizontal layers 188 and 190 are represented. The top face of the layer 188 corresponds to the face 176. A bottom face 192 of this layer 188 is turned towards a top face 193 of the layer 190. These faces 192 and 193 are assembled one on top of the other with no degree of freedom. Typically, electronic components are produced on the face 193 to form the chip 173. Similarly, the electronic components are implanted in the face 176 or in the face 192 to form the electronic chip 172. In some embodiments, the layers 188 and 190 are made of silicon.

The integrated circuit 170 also comprises a temperature probe 194 that makes it possible to measure the temperature inside the substrate 6 at the assembly interface between the layers 188 and 190. This probe 194 comprises two electrical conductors 196 and 198. It is electrically insulated from the substrate 174. The conductors 196 and 198 are electrically insulated from one another except at an electrical junction 200.

To simplify FIG. 14 and the following figures, the insulating layers and the insulating coatings are not represented.

In this embodiment, the ends of the conductors 196 and 198 that form the junction 200 are produced in the same materials as, respectively, the conductors 14 and 18.

The conductor 196 comprises: an electrical track 206 produced on the face 192, a bump contact 208 produced on the outer face 176 of the substrate 174, and an extension 210 electrically connecting the track 206 to the bump contact 208.

The bump contact 208 fulfills the same function as the bump contact 30. To this end, for example, it is configured in the same way.

The extension 210 passes vertically right through the layer 188 to emerge, on one side, under the bump contact 208 and, on the opposite side, under the track 206. Typically, the extension 210 is a via, also better known by the acronym TSV ("Through Silicon Via").

The track 206 extends horizontally between the extension 210 and a distal end 212. The distal end 212 is in mechanical contact directly with a corresponding distal end 214 of the electrical conductor 198 to form the junction 200.

In this embodiment, the conductor 198 and the conductor 196 are symmetrical relative to a vertical plane passing through the junction 200, except at the end 214.

In FIG. 14, the bump contact, the extension, and the electrical track of the electrical conductor 198 bear, respectively, the numerical references 216, 218 and 220.

The end 214 overlaps the end 212 in the Z direction. Thus, it covers the end 212. The overlapping surface area is typically greater than 10 $\mu m^2$ and, preferably, greater than 100 $\mu m^2$.

The operation of the temperature probe 194 is deducted from the operation of the probe 12.

Figure 15:
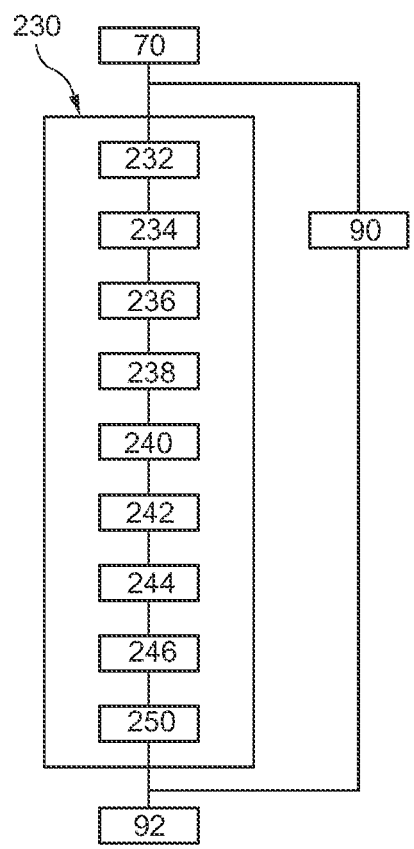
FIG. 15 is a flow diagram of a method for fabricating the integrated circuit of FIG. 14.

FIG. 15 represents a method for fabricating the integrated circuit 170. This fabrication method is identical to that of FIG. 3, except that step 72 is replaced by step 230.

Step 230 begins with step 232 for producing through vias in the position of the future extensions 210 and 218. In some practices, step 232 is carried out in the same way as step 74.

In step 234, if necessary, an insulating layer is deposited on the face 176 and on the inner walls of the vias. For example, this step is carried out like step 76.

In step 236, if necessary, a bond coat is deposited. In some practices, this step is carried out in the same way as step 78.

In step 238, the conductive material used to form the conductor 196 is deposited and then shaped by photolithography and etching to obtain the bump contact 208 and the extension 210. In some practices, this step is carried out in the same way as step 82.

In step 240, the conductive material used to form the electrical conductor 198 is deposited, then shaped by photolithography and etching to form the bump contact 216 and the extension 218. In some practices, this step is carried out in the same way as step 88.

In step 242, an insulating layer is deposited on the face 192. In some practices, this step 242 is carried out in the same way as step 234.

In step 244, the conductive material of the track 206 is deposited then shaped by photolithography and etching so as to obtain the track 206. In some practices, this step is carried out in the same way as step 238.

In step 246, the conductive material of the track 220 is deposited then shaped to obtain this track 220. This step is carried out in the same way as step 244.

Finally, in step 250, the layer 188 is assembled on the layer 190 to form the substrate 174 containing the junction 200 buried inside this substrate at the interface between these layers.

Figure 16:
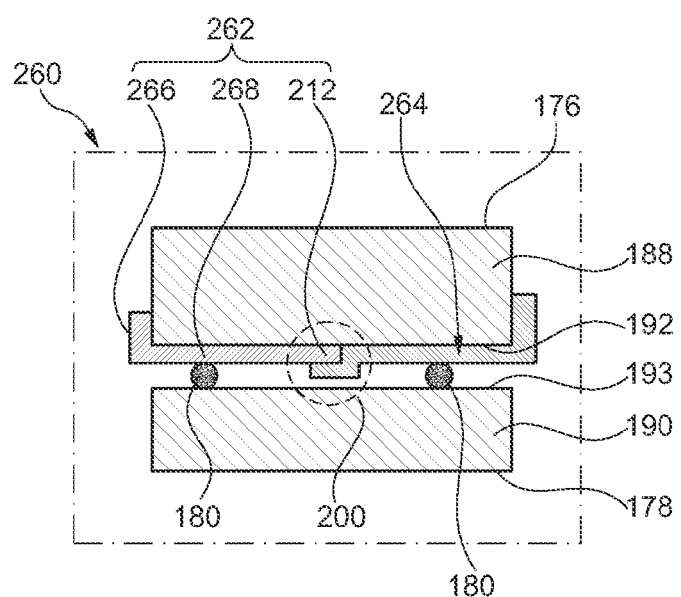
FIGS. 16 to 18 are schematic illustrations, in vertical cross section, respectively, of fifth, sixth and seventh embodiments of an integrated circuit.

FIG. 16 represents an integrated circuit 260. This integrated circuit 260 is identical to the integrated circuit 170 except that the electrical conductors 196 and 198 are replaced, respectively, by electrical conductors 262 and 264.

The electrical conductor 262 is identical to the conductor 196 except that the bump contact 208 and the track 206 are replaced, respectively, by a lateral bump contact 266 and a track 268. Furthermore, the extension 210 is omitted. The bump contact 266 is produced on a vertical side of the layer 188.

The track 268 is identical to the track 206 except that it is extended in the horizontal plane to emerge under the bump contact 266.

The conductor 264 is configured like the conductor 262 to present a lateral bump contact.

Figure 17:
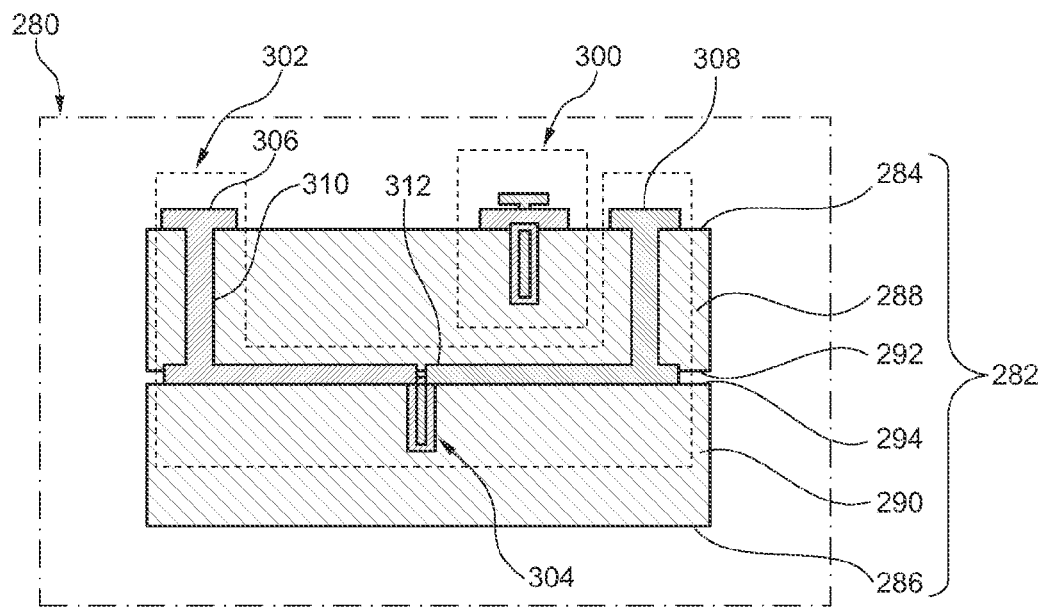

FIG. 17 represents an integrated circuit 280. This integrated circuit 280 is identical to the integrated circuit 2, except that the substrate 6 is replaced by a multilayer substrate 282 having a top face 284 and a bottom face 286. The substrate 282 comprises two layers 288 and 290 stacked one on top of the other. The top face of the layer 288 corresponds to the face 284 of the substrate. It also comprises a bottom face 292 turned towards the layer 290. The bottom face of the layer 290 corresponds to the bottom face 286 of the substrate. A top face of the layer 290 bears the reference 294.

The integrated circuit 280 comprises two temperature probes 300 and 302. The probe 300 measures the temperature inside the layer 288. It is, for example, produced like the probe 12 but from the top face 284.

The probe 302 measures the temperature inside the layer 290. This probe 302 comprises a probe 304 identical to the probe 12, but produced from the top face 294 inside the layer 290. It also comprises: bump contacts 306 and 308 on the outer face 284, and electrical connections 310 and 312 that extend from the bump contacts 306, 308 to the probe 304 through the layer 288. Typically, these connections 310 and 312 are vertical vias.

This arrangement of the probes 300 and 302 makes it possible to measure the temperature inside an integrated circuit comprising a stack of two electronic chips one on top of the other. The first chip is produced in the layer 288 and the second chip is produced in the layer 290.

Figure 18:
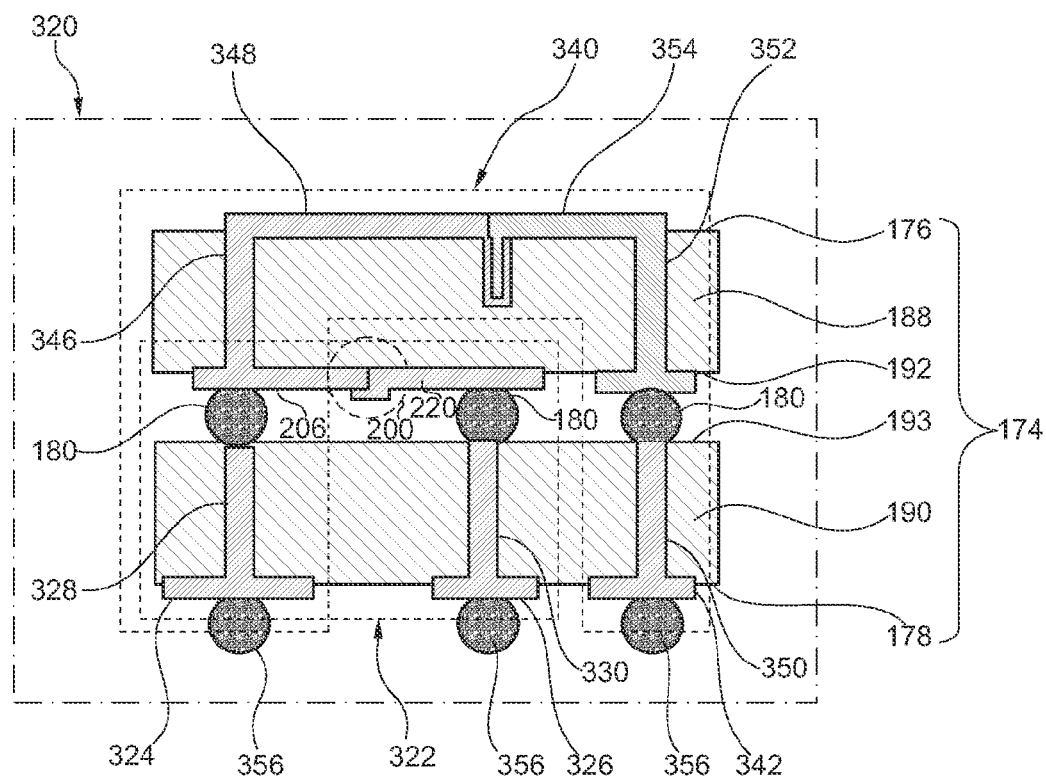

FIG. 18 represents an integrated circuit 320 identical to the integrated circuit 170 except that a temperature probe 322 replaces the temperature probe 194.

The probe 322 is identical to the probe 194, except that the bump contacts 208 and 210 are replaced by bump contacts 324 and 326 situated on the bottom face 178. To achieve this, the connections 328 and 330 pass right through the layer 190. Here, these connections are vias. A top end of these vias is linked to the tracks, respectively, 206 and 220 by fusible balls 180.

The integrated circuit 320 also comprises a temperature probe 340 for measuring the temperature inside the layer 188. This probe 340 is produced in the face 176 in the same way as the probe 12 of the integrated circuit 2, except that these bump contacts 324 and 342 are produced on the bottom face 178 of the substrate.

In this embodiment, the bump contact 324 is common to the probes 322 and 340. To this end, the bump contact 324 is electrically connected to the buried junction of the probe 340 via the track 206, a via 346 passing through the layer 188 and a horizontal track 348 produced on the face 176.

The bump contact 342 is electrically connected to the buried junction by: a via 350 passing through the layer 190, a fusible ball 180, a via 352 passing through the layer 188, and a horizontal track 354 produced on the face 176.

The bump contacts 324, 326 and 342 are, for example, soldered to a printed circuit via fusible balls 356.

In the illstrated embodiment, the layer 190 is used to link the layer 188 to the printed circuit. It is then known by the term "interposer."

Numerous other embodiments are possible. For example, the integrated circuit can comprise active or passive electronic components.

The junction can be placed at any desired depth. For example, in the embodiment of FIG. 12, the junction 63 is not necessarily midway between the faces 8 and 9. As a variant, it is situated closer to the face 8 than the face 9 or vice versa. In this case, one of the extensions is shortened, whereas the other is elongated.

The section of the extensions formed by cylinders that are sunk into the substrate can be of any form. In particular, this horizontal section can be square or rectangular. Furthermore, it is not necessary for one of the extensions to surround the other. As a variant, inside the via, the extensions are simply juxtaposed without any of these extensions surrounding the other.

Similarly, it is not necessary for the extension 52 to be a solid cylinder. As a variant, the extension 52 can also be a hollow cylinder.

The materials used to form the junction are not necessarily metals. For example, the junction can be produced by doping a semiconductor material differently on either side of the junction. Typically, one and the same dopant will be used to produce the ends of the electrical conductors, and these ends differ from one another only through the concentration of dopant.

Nor is it necessary for each electrical conductor to be entirely produced in the conductive material used to form the junction. In fact, only the end of this conductor in mechanical contact with the end of the other conductor has to be in this material. Thus, as a variant, except for the end, the rest of the electrical conductor is produced in another material chosen such that the electrical junction between this other conductive material and the end of the conductor form a junction with an absolute Seebeck coefficient value that is negligible, that is to say less than 0.5 $\mu V/K$ and, preferably, less than 0.1 or 0.01 $\mu V/K$ at 20° C. For example, the other material can be copper situated, for example, in the vias.

The substrate generally contains elements such as layers of semiconductor material. However, the semiconductor material is not necessarily silicon. Nor is most of the substrate necessarily produced from a semiconductor material. For example, most of the substrate can be produced from glass or from polymer.

If the substrate is produced in an electrically insulating material, the production of the insulating layers to insulate the electrical conductors from the substrate can be omitted.

The substrate can be homogeneous (block) or heterogeneous (with thin layers) or even multilayer (stack of substrates). When the substrate is multilayer, the different layers can be assembled to one another by means other than soldering. For example, these different layers can be assembled using a polymeric glue, conductive or not, or by direct bonding without the addition of glue.

The deposition of the insulating layer between the first and second cylinders can be carried out after the deposition of the first and second cylinders. For example, to this end, initially, a sacrificial layer is deposited in place of the insulating layer. In a second stage, the sacrificial layer is eliminated then replaced by an insulating layer.

If the vias have a sufficiently great hydraulic diameter, the bump contact may be formed by the flush end of a via on an outer face of the substrate.

As a variant, a blind via can pass through a number of layers of the substrate to make it possible to measure the temperature of an electronic chip produced in a buried layer from an outer face of the substrate.

The invention claimed is:

1. An apparatus that comprises an integrated circuit, wherein said integrated circuit comprises a substrate, an electronic component, a first electrical conductor, and a second electrical conductor, wherein said substrate extends in a substrate plane, wherein said substrate has a plurality of external substrate surfaces, wherein said electronic component is disposed at a location selected from the group consisting of inside one of said plurality of external substrate surfaces and on one of said plurality of external substrate surfaces, wherein said first electrical conductor comprises a first bump contact, wherein said first bump contact is on one of said plurality of external substrate surfaces, wherein said first electrical conductor comprises a first end, wherein said first electrical conductor is electrically insulated from said substrate, wherein said second electrical conductor comprises a second bump contact, wherein said second electrical conductor comprises a second end, wherein said second bump contact is on one of said plurality of external substrate surfaces, wherein said second electrical conductor is electrically insulated from said substrate, wherein said second electrical conductor is electrically insulated from said first electrical conductor except at said second end of the second conductor, wherein said second end of the second conductor is mechanically and electrically directly in contact with said first end of the first conductor to form an electrical junction, wherein said first and second ends are entirely buried to at least 5 μm deep inside said substrate relative to one of said plurality of external substrate surfaces, wherein said first and second ends are formed of different materials chosen to achieve a Seebeck coefficient of said junction having an absolute value that is greater than 1 μV/K at 20° C., and wherein a combination of said first and second conductors forms a temperature probe.

2. The apparatus of claim 1, wherein said integrated circuit further comprises a blind via formed in a face of said substrate, wherein said first electrical conductor comprises a first extension that is driven into said substrate to electrically connect said first end to said first bump contact, wherein said second electrical conductor comprises a second extension that is driven into said substrate to electrically connect said second end to said second bump contact, wherein said first extension comprises a first cylinder, wherein said first cylinder has a first distal end that is buried into said substrate by said via to a depth of at least five micrometers, wherein said second extension comprises a second cylinder, wherein said second cylinder has a second distal end that is buried into said substrate by said via to a depth of at least five micrometers, wherein said first distal end is made of said first material, wherein said second distal end is made of said second material, wherein said first distal end forms said first buried end of said first electrical conductor, wherein said second distal end forms said second buried end of said electrical conductor, wherein said first cylinder extends inside said via from said face of said substrate to said first end, wherein said second cylinder extends inside said via from said face of said substrate to said first end, and wherein said integrated circuit further comprises a layer of electrical insulator situated everywhere between said first and second cylinders except between said first and second ends.

3. The apparatus of claim 2, wherein said substrate forms a first substrate having a top face, and said circuit comprises a second substrate having a bottom face directly joined to said top face of said first substrate and a top face on a side opposite said bottom face, wherein said first and second substrates are joined together forming, respectively, first and second layers of a third, thicker substrate, wherein said layers extend essentially parallel to a plane of said third substrate, wherein said blind via is formed from said face or faces of said first substrate, and said second substrate comprising third and fourth bump contacts are arranged on said top face and are electrically connected, respectively, to said first and second bump contacts.

4. The apparatus of claim 1, wherein said first electrical conductor comprises a first extension driven into said substrate to electrically connect said first end to said first bump contact, wherein said first electrical conductor comprises a first extension driven into said substrate to electrically connect said first end to said first bump contact, wherein said second electrical conductor comprises a second extension driven into said substrate to electrically connect said second end to said second bump contact, wherein said second electrical conductor comprises a second extension driven into said substrate to electrically connect said second end to said second bump contact, wherein said first extension comprises a first cylinder, wherein said first cylinder has a distal end, wherein said distal end is buried inside said substrate, wherein said distal end is made of said first material, to form said first end of said first electrical conductor, wherein said first cylinder extends inside a first via formed from a first face of said substrate to said first end, wherein said second extension comprises a second cylinder, wherein a distal end of said second cylinder is buried inside said substrate, wherein said distal end is produced from said second material to form said second end of said second electrical conductor, wherein said second cylinder extends inside a second via to said second end, wherein said second via is formed from a second face of said substrate, wherein said second face is situated on a side opposite said first face, and wherein a bottom of said second via emerges on said first end of said first cylinder.

5. The apparatus of claim 4, wherein said substrate defines a first substrate having a top face, and said integrated circuit further comprises a second substrate having a bottom face directly joined to said top face of said first substrate and a top face on a side opposite said bottom face, wherein said first and second substrates are joined together forming, respectively, first and second layers of a third, thicker substrate, wherein said layers extend essentially parallel to a plane of said third substrate, wherein said first and second vias are formed from said face or faces of said first substrate, and said second substrate comprising third and fourth bump contacts are arranged on said top face and are electrically connected, respectively, to said first and second bump contacts.

6. The apparatus of claim 1, wherein said substrate comprises at least one first layer having a top face and one second layer having a bottom face assembled directly on said top face of said first layer, said layers extending essentially parallel to said plane of said substrate, wherein said first and second electrical conductors comprise, respectively, first and a second conductive tracks produced on said top face of said first layer or on said bottom face of said second layer and extending essentially parallel to said plane of said substrate, wherein distal ends of said tracks are situated between said first and second layers, wherein said distal ends of said tracks form, respectively, said buried first and second ends of said first and second electrical conductors.

7. The apparatus of claim 6, wherein said first and second conductors comprise, respectively, first and a second extensions driven into said substrate to electrically connect said first and second tracks, respectively, to said first and second bump contacts, at least one of said extensions being formed by a via passing through one of said first and said second layers.

8. The apparatus of claim 6, wherein said distal ends of said first and second tracks overlap one another in a direction at right angles to said plane of said substrate.

9. The apparatus of claim 1, wherein a shortest distance between each bump contact and said junction is at least greater than 50 μm.

* * * * *